(12) United States Patent
Ichikawa

(10) Patent No.: US 10,593,843 B2
(45) Date of Patent: Mar. 17, 2020

(54) METHOD OF MANUFACTURING OPTICAL COMPONENT

(71) Applicant: NICHIA CORPORATION, Anan-shi, Tokushima (JP)

(72) Inventor: Masatsugu Ichikawa, Tokushima (JP)

(73) Assignee: NICHIA CORPORATION, Anan-Shi (JP)

( * ) Notice: Subject to any disclaimer, the term of this patent is extended or adjusted under 35 U.S.C. 154(b) by 0 days.

(21) Appl. No.: 15/906,870

(22) Filed: Feb. 27, 2018

(65) Prior Publication Data
US 2018/0248087 A1    Aug. 30, 2018

(30) Foreign Application Priority Data

Feb. 28, 2017 (JP) ................................ 2017-035761
May 12, 2017 (JP) ................................ 2017-095202
Jul. 18, 2017 (JP) ................................ 2017-138809

(51) Int. Cl.
*H01L 23/00* (2006.01)
*H01L 33/58* (2010.01)
(Continued)

(52) U.S. Cl.
CPC .............. *H01L 33/58* (2013.01); *C03C 27/08* (2013.01); *H01L 24/83* (2013.01);
(Continued)

(58) Field of Classification Search
CPC . H01L 2924/00; H01L 24/95; H01L 33/0079; H01L 33/58; H01L 33/60; H01L 2224/83224
See application file for complete search history.

(56) References Cited

U.S. PATENT DOCUMENTS 7,189,631 B2 * 3/2007 Yamazaki ........... H01L 27/1214
438/458
2003/0223535 A1 * 12/2003 Leedy ................. B81C 1/00246
378/34
(Continued)

FOREIGN PATENT DOCUMENTS

CN    101246820 A    8/2008
EP    2 819 188 A1    12/2014
(Continued)

OTHER PUBLICATIONS

De Pablos-Martin et al, Structural Characterization of Laser Bonded Sapphire Wafers Using a Titanium Absorber film, Journal of Materials Science & Technology, vol. 31, Mar. 20, 2015 (Mar. 20, 2015), pp. 484-488.
(Continued)

*Primary Examiner* — Jaehwan Oh
(74) *Attorney, Agent, or Firm* — Foley & Lardner LLP

(57) ABSTRACT

A method of manufacturing an optical component for an optical semiconductor includes: providing a joined body including: a first member having light transmissivity and containing at least one element selected from the group consisting of oxygen, fluorine, and nitrogen, and a second member, wherein the first member and the second member are joined together via a metal joining member made by directly bonding a first metal film formed on the first member and a second metal film formed on the second member; and irradiating the joining member with a laser beam or a microwave.

20 Claims, 13 Drawing Sheets

(51) Int. Cl.
*H01L 33/50* (2010.01)
*H01L 33/60* (2010.01)
*C03C 27/08* (2006.01)
*H01L 33/00* (2010.01)

(52) U.S. Cl.
CPC ........ *H01L 33/0079* (2013.01); *H01L 33/502* (2013.01); *H01L 33/60* (2013.01); *H01L 2224/83009* (2013.01); *H01L 2224/8322* (2013.01); *H01L 2224/83224* (2013.01); *H01L 2224/83894* (2013.01); *H01L 2933/0041* (2013.01); *H01L 2933/0058* (2013.01)

(56) References Cited

U.S. PATENT DOCUMENTS

| | | | |
|---|---|---|---|
| 2004/0184502 A1* | 9/2004 | Miyachi | B82Y 20/00 |
| | | | 372/50.1 |
| 2006/0006408 A1 | 1/2006 | Suehiro et al. | |
| 2012/0165801 A1* | 6/2012 | Bragagna | A61B 18/20 |
| | | | 606/16 |
| 2014/0230990 A1* | 8/2014 | Karam | C03C 27/00 |
| | | | 156/64 |
| 2014/0335301 A1* | 11/2014 | Van 'T Oever | B81C 1/00269 |
| | | | 428/76 |
| 2015/0140710 A1* | 5/2015 | McLaurin | H01S 5/34333 |
| | | | 438/31 |
| 2015/0229107 A1* | 8/2015 | McLaurin | H01S 5/4093 |
| | | | 372/45.01 |
| 2015/0229108 A1* | 8/2015 | Steigerwald | H01S 5/4093 |
| | | | 372/45.01 |
| 2016/0336716 A1* | 11/2016 | Adachi | H01S 5/02288 |
| 2016/0372893 A1* | 12/2016 | McLaurin | H01L 24/95 |
| 2017/0288102 A1* | 10/2017 | Farrens | H01L 27/156 |
| 2017/0342576 A1* | 11/2017 | McWaid | C25B 11/02 |
| 2017/0373474 A1* | 12/2017 | Kanehara | H01T 13/14 |
| 2018/0136134 A1* | 5/2018 | Shibayama | G01N 21/658 |

FOREIGN PATENT DOCUMENTS

| | | |
|---|---|---|
| JP | 2011-233939 A | 11/2011 |
| JP | 2012-161925 A | 8/2012 |

OTHER PUBLICATIONS

Shimatsu et al, Atomic diffusion bonding of wafers with thin nanocrystalline metal films, Journal of Vacuum Science and Technology: Part B, vol. 28, No. 4, Jun. 28, 2010 (Jun. 28, 2010), pp. 706-714.

* cited by examiner

TEM image | electron diffraction pattern (A part) | electron diffraction pattern (B part)

TEM image | electron diffraction pattern (A part) | electron diffraction pattern (B part)

METHOD OF MANUFACTURING OPTICAL COMPONENT

CROSS-REFERENCE TO RELATED APPLICATIONS

This application claims priority to Japanese Patent Application No. 2017-035761, filed on Feb. 28, 2017, Japanese Patent Application No. 2017-095202, filed on May 12, 2017, and Japanese Patent Application No. 2017-138809, filed on Jul. 18, 2017, the disclosures of which are hereby incorporated by reference in their entireties.

BACKGROUND

The present disclosure relates to a method of manufacturing an optical component for an optical semiconductor.

In a light-emitting diode (LED) element such as that described in Japanese Patent Publication No. 2011-233939, a light-transmissive member and a light-emitting element are joined together (see, for example, FIG. 11 of Japanese Patent Publication No. 2011-233939).

In the method mentioned in Japanese Patent Publication No. 2011-233939, the light-transmissive member and the light-emitting element are joined by thermal compression bonding. There are other methods of joining a light-transmissive member and a light-emitting element, for example, by joining via resin or surface activated bonding. However, when the light-transmissive member and the light-emitting element are joined together by thermal compression bonding, heat at a relatively high temperature is applied to each member, which might damage the members. When the members are joined together via resin, the properties of the optical component may be degraded because of deterioration of the resin caused by light absorbed into the resin and/or long-term use of the resin. When using surface activated bonding to join the members, these members are sometimes difficult to join together, depending on the surface state and material of the members.

SUMMARY

According to one embodiment, a method of manufacturing an optical component for an optical semiconductor comprises: providing a joined body in which a first member having light transmissivity and a second member are joined together via a joining member made of metal by directly bonding a first metal film formed on the first member and a second metal film formed on the second member, the first member containing at least one element selected from the group consisting of oxygen, fluorine, and nitrogen; and irradiating the joining member with a laser beam or a microwave to make a transmittance of the joining member for light with a predetermined wavelength higher than a transmittance of the joining member for the light in an original state.

This enables simplified manufacturing of the optical component less likely to absorb light, which is emitted from the light-emitting element or the like, into the joining member.

DETAILED DESCRIPTION

Certain embodiments will be described below with reference to the accompanying drawings. The following embodiments are provided only to exemplify the technical ideas of the present invention, and are not to be construed to limit the present invention. Note that the sizes, positional relationships, and the like of members illustrated in the respective drawings are exaggerated in some cases for clarity.

<First Embodiment>

Figure 1A:
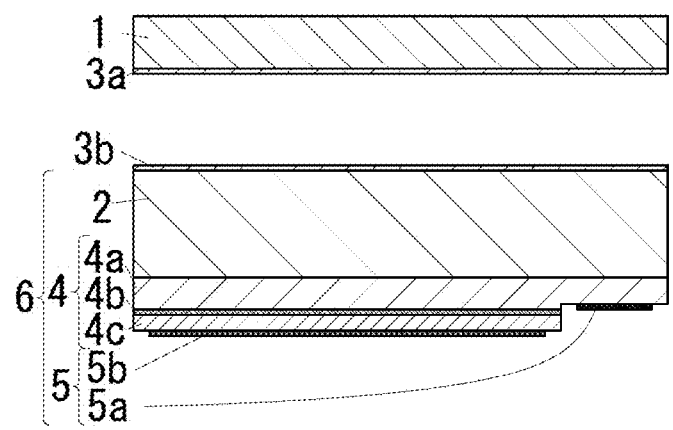
FIG. 1A is a diagram for explaining a method of manufacturing an optical component according to a first embodiment.
Figure 1B:
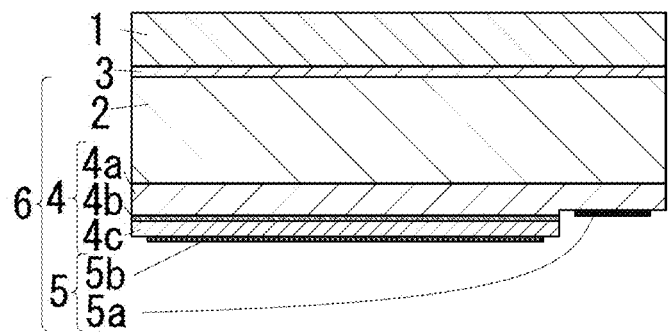
FIG. 1B is a diagram for explaining the method of manufacturing an optical component according to the first embodiment.
Figure 1C:
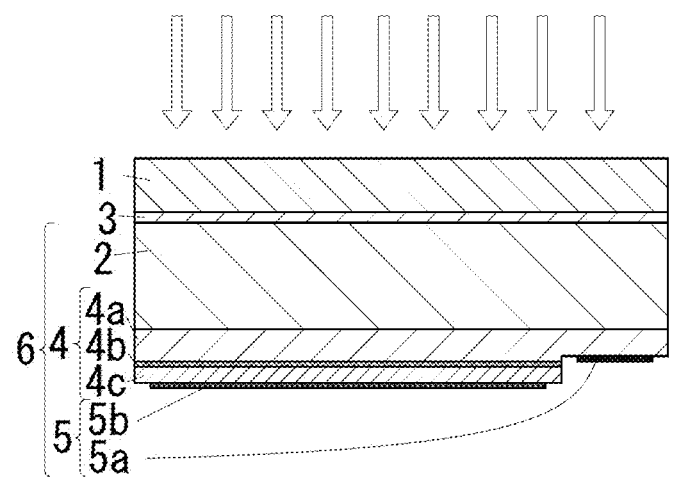
FIG. 1C is a diagram for explaining the method of manufacturing an optical component according to the first embodiment.
Figure 2A:
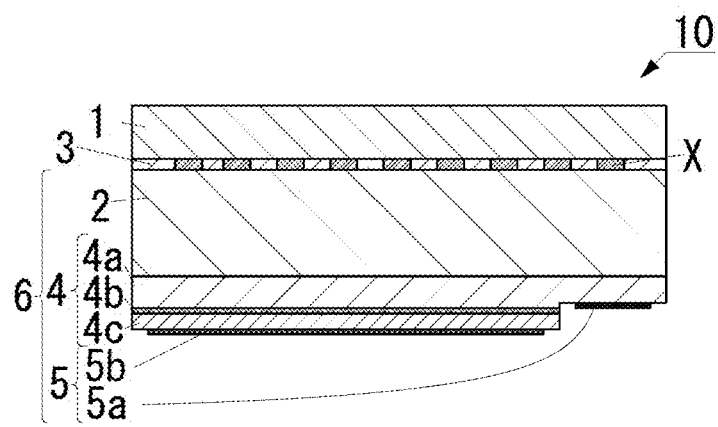
FIG. 2A is a cross-sectional view of the optical component obtained by the method of manufacturing an optical component according to the first embodiment.
Figure 2B:
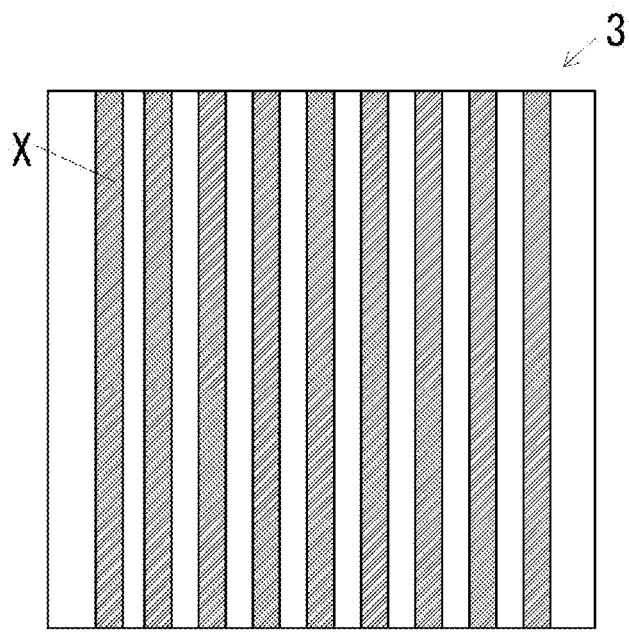
FIG. 2B is a top view of a joining member included in the optical component of the first embodiment.

FIGS. 1A to 1C show a method of manufacturing an optical component 10 according to a first embodiment. FIG. 2A is a cross-sectional view of the optical component 10 obtained by the present embodiment, and FIG. 2B is a top view of a joining member 3 included in the optical component 10. In FIG. 2B, hatched regions X are regions having a high transmittance for light with a predetermined wavelength.

The method of manufacturing the optical component 10 includes the steps of: providing a joined body in which a first member 1 and a second member 2 both having light-transmissive are joined together via a joining member 3 made of metal by directly bonding a first metal film 3a formed on the first member 1 containing oxygen and a second metal film 3b formed on the second member 2; and irradiating the joining member 3 with a laser beam to make a transmittance of the joining member 3 for light with a predetermined wavelength higher than a transmittance of the joining member in an original state.

This arrangement obtained by the method of manufacturing the optical component 10 can easily manufacture the optical component 10 that reduces absorption of the light with a predetermined wavelength emitted from the light-emitting element or the like into the joining member 3.

In a joined body in which the first member and the second member are joined together via the joining member made of metal, the light extraction efficiency might be reduced because the light from the light-emitting element or the like is absorbed by the joining member. For this reason, in the present embodiment, after providing the joined body, the joining member 3 made of metal in the joined body is irradiated with a laser beam. Thus, the transmittance of the joining member 3 for the light with the predetermined wavelength after irradiation with the laser beam is made higher than the transmittance of the joining member 3 for the light with the predetermined wavelength before irradiation with the laser beam. This is considered to occur for reasons mentioned below. The joining member 3 is heated by being irradiated with the laser beam. At this time, oxygen contained in the first member 1 is bonded to the metal of the joining member 3. Thus, it is considered that in regions of the joining member 3 irradiated with the laser beam, the joining member 3 is converted from metal into a compound containing oxygen, resulting in a high transmittance for light with the predetermined wavelength.

The term "transmittance of the joining member 3" as used herein refers to a ratio of transmitting light from a light-emitting element or the like of the joining member. For example, when a semiconductor light-emitting element is included in a part of the optical component (that is, the first member and the light-transmissive second member included in the light-emitting element are joined together), the term "transmittance of the joining member 3" refers to a ratio of transmitting light with a peak wavelength of the light-emitting element including the second member 2. When the light-emitting element is not included in a part of the optical component (that is, the optical component and the light-emitting element are combined to form a light-emitting device), the term "transmittance of the joining member 3" refers to a ratio of transmitting light with a peak wavelength of the light-emitting element, which is to be combined with the optical component.

The method of manufacturing the optical component 10 will be described in detail below.

(Providing Joined Body)

First, as shown in FIG. 1A, the first metal film 3a is formed on the light-transmissive first member 1 containing oxygen, and the second metal film 3b is formed on the light-transmissive second member 2. Then, as shown in FIG. 1B, the first metal film 3a and the second metal film 3b are directly bonded together to provide a joined body in which the first member 1 and the second member 2 are joined together via the joining member 3 made of metal. Specifically, in the present embodiment, a sapphire substrate is used as the first member 1, and a sapphire substrate included in a light-emitting element 6 is used as the second member 2.

In the present embodiment, the joined body is provided by using an atomic diffusion bonding method. Specifically the formation of the first metal film 3a, the formation of the second metal film 3b, and the joining of the first metal film 3a and the second metal film 3b are performed in an ultra high vacuum. In this way, the first member 1 and the second member 2 are not required to be heated excessively when joining the first metal film 3a and the second metal film 3b, which can alleviate deterioration of the first member 1 and the second member 2 due to heat during joining. This can also reduce the probability that substances contained in the atmosphere attach to the lower surface of the first metal film 3a and the upper surface of the second metal film 3b. In other words, substances other than the first metal film 3a and the second metal film 3b are less likely to enter between the first metal film 3a and the second metal film 3b. Thus, a joining force between the first metal film 3a and the second metal film 3b can be enhanced. Further, because no unwanted material enters between the first metal film 3a and the second metal film 3b, light absorption can be easily reduced. After the first metal film 3a and the second metal film 3b are formed by a known method, such as a sputtering method, the first metal film 3a and the second metal film 3b may be joined together by activating the surfaces of the respective metal films using the surface activated bonding method. Also, in the case of using the surface activated bonding method, the deterioration of the first member 1 and the second member 2 due to heat during joining can be alleviated because the metal films can be joined together without excessively heating the first member 1 and the second member 2.

Here, although the first member 1 containing oxygen is used as the first member 1 as mentioned above, a member containing at least one element selected from the group consisting of oxygen, fluorine, and nitrogen (hereinafter, also referred to as "oxygen or the like") can be used as the first member 1. Also, in the case of using these members, similar to the case of using the member containing oxygen, the transmittance of the joining member for light with a predetermined wavelength can be enhanced by irradiation with the laser beam.

The first member 1 can be formed using material that does not absorb a laser beam and a microwave serving as a heating source. Other than the sapphire substrate, for example, a glass plate, a phosphor-containing plate which contains a phosphor, or a lens can be used. The phosphor-containing plate that is used may be a plate containing a phosphor as a whole, or a plate, shown in FIG. 4A or the like, which includes a phosphor portion 1*a* containing a phosphor and a light reflective portion 1*b* provided on lateral surface of the phosphor portion 1*a*. The reflective portion 1*b* surrounds the phosphor portion 1*a* viewed from above. In this way, even if a part of the first member 1 includes a non-light-transmissive region (the light reflective portion 1*b* in FIG. 4A), as long as another part of the first member includes the light-transmissive region (the phosphor portion 1*a* in FIG. 4A), such first member is regarded as the first member 1 described in the present specification. Examples of the usable phosphor included in the phosphor-containing plate can include materials containing known phosphors, such as a YAG phosphor and a LAG phosphor. The light reflecting portion 1*b* can be formed using ceramic such as aluminum oxide.

The second member 2 is preferably formed using material that contains at least one element selected from the group consisting of oxygen, fluorine, and nitrogen in a region where the second metal film 3*b* of the second member 2 is formed. Thus, oxygen or the like contained in the second member 2 as well as the first member 1 can be bonded to the metal of the joining member 3, thereby enabling improvement of the transmittance of the joining member 3.

In the present embodiment, a light-emitting diode (LED) including a substrate and a light-emitting structure 4 are used as the light-emitting element 6. A sapphire substrate positioned on the light-emitting surface side of the LED is defined as the second member 2. The second metal film 3*b* is formed on a main surface of the sapphire substrate different from the other main surface thereof provided with the light-emitting structure 4. Thus, oxygen contained in the sapphire substrate can be bonded to the joining member 3. Further, the absorption of light in electrodes 5 can be reduced. Thus, the improvement of the light extraction efficiency as the optical component 10 can be expected. This will be described in detail below. When a semiconductor wafer is singulated into LEDs, the singulation becomes difficult if the thickness of the substrate positioned on the light-emitting surface side of the LED is increased. On the other hand, if the thickness of the substrate is decreased, light generated from an active layer and reflected by an upper surface of the light-emitting element is more likely to strike the electrodes, so that the light might be absorbed by the electrodes and thereby attenuated. The first member 1 is joined to the substrate positioned on the light-emitting surface side of the LED 6, so that the thickness of a part within which light is repeatedly reflected (a part including the light-emitting structure 4, the substrate as the second member 2, and the first member 1) can be increased. Thus, it is considered that the absorption of light in the electrodes 5 can be reduced because the number of irradiation of an n-electrode 5*a* and a p-electrode 5*b* with the light from an active layer 4*b* can be decreased.

In the present embodiment, the substrate positioned on the light extraction surface side of the LED 6 is the second member 2, and the light-emitting structure 4 is an optical semiconductor, but alternatively, when the substrate is not provided on the light extraction surface side of the LED (that is, a part of the light-emitting structure 4 is used as the second member), the part of the light-emitting structure 4 positioned on the light extraction surface side may be the second member. For example, referring to FIG. 1A, when the substrate 2 is not positioned on the light-emitting surface side of the light-emitting element 6, a part of the upper surface side of an n-side semiconductor layer 4*a* functions as the second member 2, and another part of the lower surface side of the n-side semiconductor layer 4*a* functions as a part of the light-emitting structure 4. As the light-transmissive second member 2, the same kind of member as that mentioned in the first member 1, as well as a substrate included in the light-emitting element 6 can be used.

In the present embodiment, the light-transmissive second member is used as the second member 2, but a non-light-transmissive second member may be used as the second member. The non-light-transmissive second member 2 can be formed using, for example, a metal plate, a resin plate, or a semiconductor wafer with a small energy bandgap which is made up of Si or the like.

The first metal film 3*a* and the second metal film 3*b* can be formed using any material that enhances the transmittance for the light with the predetermined wavelength by being bonded to oxygen or the like contained in the first member 1. When oxygen is contained in the first member 1, for example, metal having a large standard free energy of formation, such as Al, Ti, or Ta, can be used for the first and second metal films. When fluorine is contained in the first member 1, for example, Mg, Li, or Ca can be used. When nitrogen is contained in the first member 1, for example, Si, Al, or Zn can be used. The first metal film 3*a* and the second metal film 3*b* are preferably made of the same material. This can reduce a difference in refractive index between the first metal film 3*a* and the second metal film 3*b*, thereby reducing the decrease in the light extraction efficiency.

The thickness of the joining member 3 can be appropriately selected depending on its material, but is preferably in a range of 0.2 nm to 5 nm, and more preferably in a range of 0.4 nm to 2 nm. The joining strength between the joining member 3 and the first and second members 1 and 2 can be enhanced by forming the joining member 3 with a thickness of 0.2 nm or more. Furthermore, the light transmittance of the joining member 3 can be easily improved in a step of irradiating the joining member 3 with a laser beam or a microwave by setting the thickness of the joining member at 5 nm or less.

In the case where sapphire or glass is used for the first member 1 and the second member 2, and Al or Ti is used for the first metal film 3*a* and the second metal film 3*b*, it is preferable that the surface on which the first metal film 3*a* is formed and the surface on which the second metal film 3*b* is formed are subjected to a hydrophilization treatment to be converted into hydrophilic surfaces before forming the first metal film 3*a* and the second metal film 3*b*. For example, the surface of the first member 1 on which the first metal film 3*a* is formed and the surface of the second member 2 on which the second metal film 3*b* is formed are washed with water to be converted into hydrophilic surfaces. Thus, the amount of oxygen that can be taken into the joining member 3 can be increased, thereby making it possible to improve the light transmittance of the joining member 3 in a step of providing the joined body. Therefore, the light transmittance of the joining member 3 irradiated with a laser beam or a microwave can be made higher, as will be mentioned later.

Figure 15A:
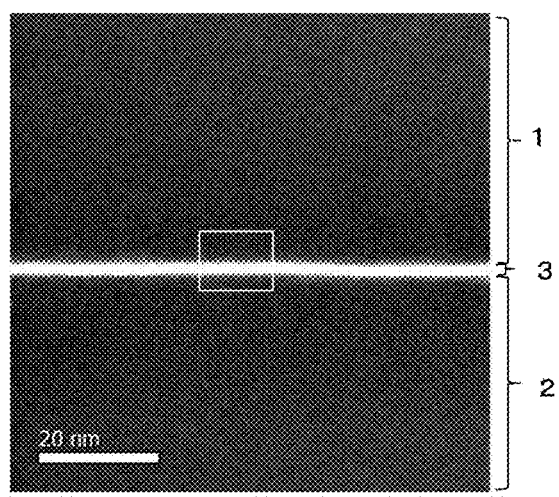
FIG. 15A shows a scanning transmission electron microscope image of the vicinity of a joining member in a joined body according to another example.
Figure 15B:
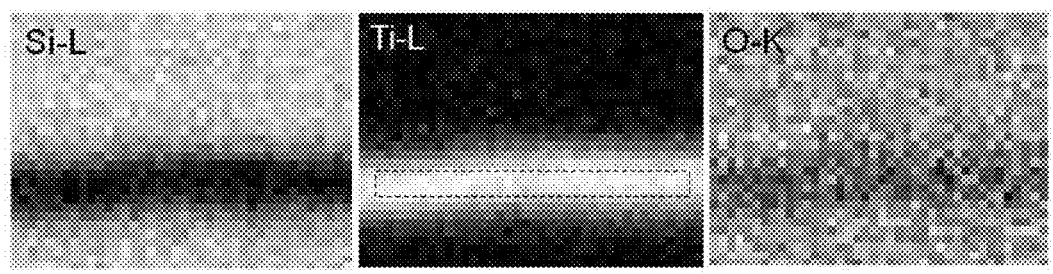
FIG. 15B shows analysis results of the joining member and its vicinity in a joined body according to another example.

It can be confirmed from the analysis results of the joined body according to other examples shown in FIGS. 15A and 15B that the amount of oxygen taken into the joining member 3 can be increased by using the hydrophilic surface before the irradiation with the laser beam or microwave.

Figure 16A:
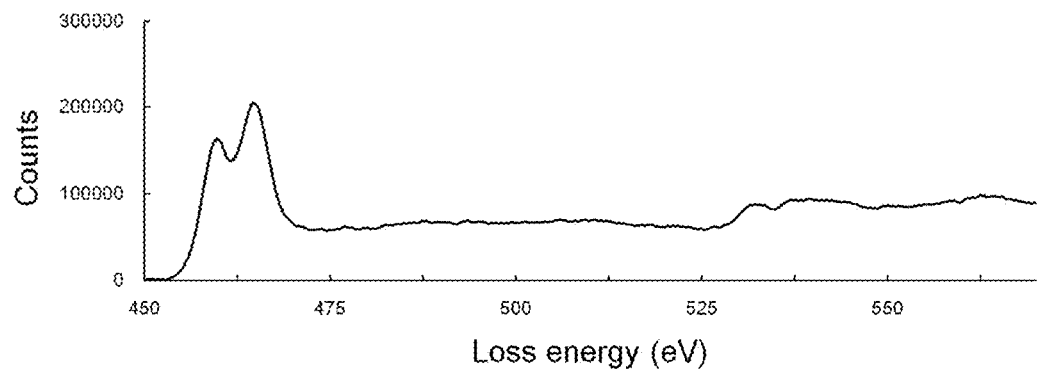
FIG. 16A is a loss spectrum diagram of the joining member in a joined body according to another example.
Figure 16B:
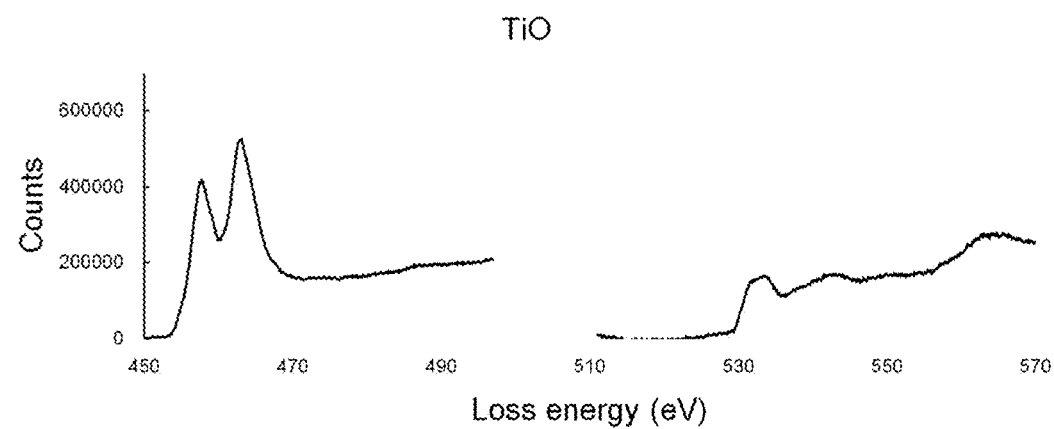
FIG. 16B is a loss spectrum diagram of TiO.
Figure 16C:
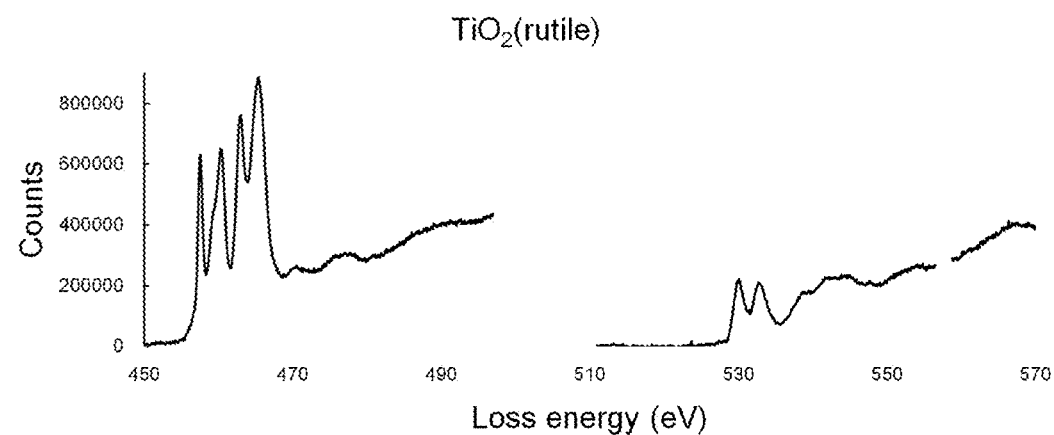
FIG. 16C is a loss spectrum diagram of rutile-type $TiO_2$.

FIG. 15A shows dark-field images obtained by observing the joining member 3 and its vicinity with a scanning transmission electron microscope (STEM). Here, quartz glass was used as the material for the first member 1 and the second member 2. After the respective surfaces of the first and second members were washed with acid and water to be converted into hydrophilic surfaces, the first metal film 3a and the second metal film 3b, each made of Ti with a thickness of 1 nm, were formed on the respective hydrophilic surfaces, and then the first and second metal films 3a and 3b were joined together to provide the joined body. FIG. 15B shows the results of mapping measurement of silicon, titanium, and oxygen within a frame of FIG. 15A by electron energy loss spectroscopy (EELS). In the left diagram of FIG. 15B, a white region is a region where silicon is strongly detected, and a black region is a region where the joining member 3 is located. In the central diagram of FIG. 15B, titanium is detected in a white region corresponding to the black region in the left diagram. In the right diagram of FIG. 15B, oxygen is detected in a region corresponding to the black region in the left figure, which shows that the joining member 3 contains titanium and oxygen. This is clear from an energy-loss spectrum (hereinafter referred to as an "EELS spectrum") of the joining member 3 (within the frame enclosed by the broken line in the central diagram of FIG. 15B) shown in FIG. 16A. FIG. 16B is an EELS spectrum of TiO, whereas FIG. 16C is an EELS spectrum of a rutile-type $TiO_2$. In FIGS. 16A to 16C, a spectrum near the 460 eV shows the L shell of Ti, and a spectrum near the 530 eV shows the K shell of O. The spectral shapes of the L-shell of Ti and the K-shell of O in the EELS spectrum shown in FIG. 16A are similar to those of the L-shell of Ti in TiO and the K-shell of O in TiO, and the peak wavelength of the L-shell of Ti in the EELS spectrum shown in FIG. 16A is close to the peak wavelength of the rutile-type $TiO_2$. From this, it is considered that the joining member 3 contains titanium and oxygen.

When the surfaces of the first member 1 and the second member 2 are converted into the hydrophilic surfaces before formation of the first metal film 3a and the second metal film 3b, metal atoms and oxygen atoms are occasionally contained in the joining member 3. Even in this case, the joining member containing metal as a main component can be implied in the "joining member 3 made of metal" as used herein.

In the case where the surfaces of the first member 1 and the second member 2 are converted into the hydrophilic surfaces, for example, when the thicknesses of the first metal film 3a and the second metal film 3b are relatively thin, oxygen atoms may be occasionally contained in the joining member 3 at a certain ratio in the joined body. Even this case is common to the case where the main component of the joining member is metal in that the joining member 3 in the joined body contains metal atoms. In any case, according to the present embodiment, the transmittance of the joining member 3 for the light with the predetermined wavelength can be made higher than the transmittance thereof in the original state by irradiating the joining member with the laser beam.

(Irradiating Joining Member 3 with Laser Beam or Microwave)

Then, as shown in FIG. 1C and FIG. 2A, the transmittance of the joining member 3 for the light with a predetermined wavelength is made higher than the original transmittance by irradiating the joining member 3 with a laser beam. Thus, the absorption of the light from the light-emitting element 6 by the joining member 3 can be reduced, thus obtaining the optical component 10 having a high transmittance for light with a predetermined wavelength. For example, in a joined body that includes the first member 1 and the second member 2 made of quartz glass and the joining member 3 made of Al with a thickness of 0.8 nm, a transmittance of the joined body for the light with a wavelength of 400 nm was approximately 87%. Meanwhile, an optical component was provided by irradiating a joined body, obtained on the same conditions, with a laser beam having an irradiation region of 130 μm while shifting in width by 20 μm, thereby forming multiple rows of the irradiation regions. It was confirmed that the resulting optical component had a transmittance of approximately 98% for light with a wavelength of 400 nm. Only the joining member 3 and its vicinity can be heated by irradiation with the laser beam as in the present embodiment. Therefore, the deterioration of the first member 1 and the second member 2 can be reduced. For example, in the case where the first member 1 and the light-emitting element 6 are joined together as in the present embodiment, when the whole of the light-emitting element 6 is heated, the electrodes 5 included in the light-emitting element 6 are also heated and thus could not exhibit its own function. However, this can be avoided by the present embodiment. Note that in the case where an optical component which does not include a material deteriorated by being irradiated with a microwave is used as the optical component, the optical component may be irradiated with a microwave instead of a laser beam.

Examples of a device that generates the usable laser beam include: a solid-state laser such as a YAG laser; a gas laser such as a KrF excimer laser and a $CO_2$ laser; and a semiconductor laser. In the present embodiment, the laser beam is irradiated from the first member 1 side because the laser beam is allowed to focus easily. The irradiation with the laser beam is not limited thereto, and when both the first member 1 and the second member 2 are made of a light-transmissive material, the laser beam may be irradiated from the second member 2 side. For example, when a phosphor-containing plate is used as the first member 1 and a sapphire substrate is used as the second member 2, the irradiation with a laser beam from the second member 2 side is preferable. This is because the joining member 3 is irradiated with the laser beam without being scattered, and thereby the joining member 3 can be irradiated with concentrated high-density energy.

When the transmittance of the joining member 3 for the light with the predetermined wavelength is enhanced by irradiation with the laser beam, the transmittance of only a partial region of the joining member 3 is preferably made higher than the transmittance thereof in the original state. That is, a metal region is partially left in the joining member 3. This is because, even if an adhesion force between the first member 1 and the joining member 3 is reduced by bonding oxygen or the like contained in the first member 1 with the joining member 3, the adhesion force can be maintained in the region (metal region) not irradiated with the laser beam. In the present embodiment, as shown in FIG. 2B, the laser beam is irradiated in a vertical stripe shape as viewed from above, but the present invention is not limited thereto. The width of the irradiation region formed by one irradiation of the laser beam can be controlled by changing a distance from the upper surface of the joining member 3 to the focal point of the laser beam.

The microwave can be generated by a microwave annealing apparatus. Also, in the case of irradiation with a microwave, similar to the case of irradiation with a laser beam, it is presumed that the joining member 3 is heated, causing oxygen or the like contained in the first member 1 to be bonded to the joining member 3, thereby enhancing the light transmittance of the joining member 3.

<Second Embodiment>

Figure 3A:
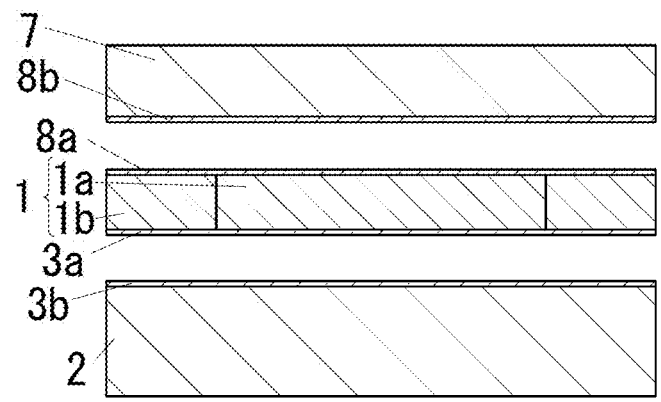
FIG. 3A is a diagram for explaining a method of manufacturing an optical component according to a second embodiment.
Figure 3B:
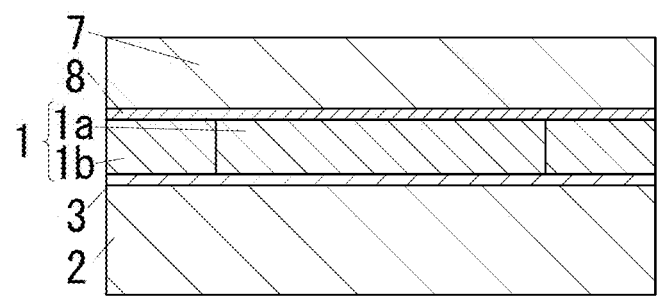
FIG. 3B is a diagram for explaining the method of manufacturing an optimal component according to the second embodiment.
Figure 3C:
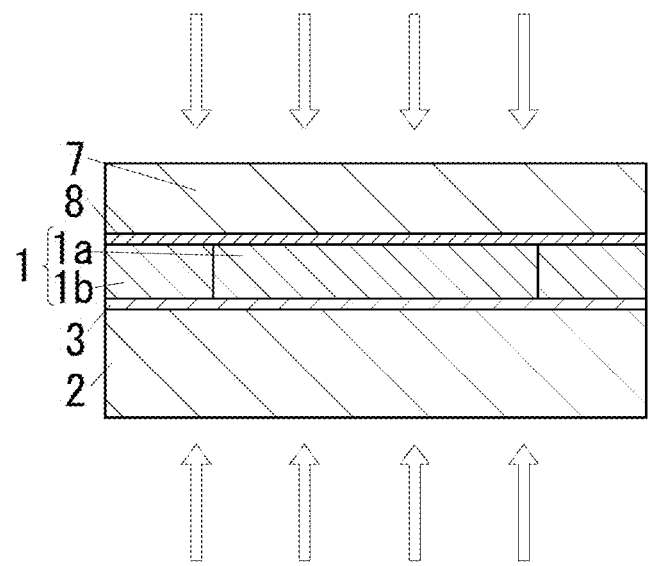
FIG. 3C is a diagram for explaining the method of manufacturing an optimal component according to the second embodiment.
Figure 4A:
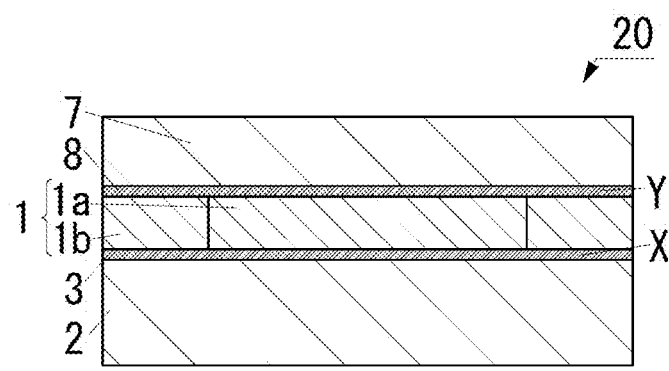
FIG. 4A is a cross-sectional view of the optical component obtained by the method of manufacturing an optical component according to the second embodiment.
Figure 4B:
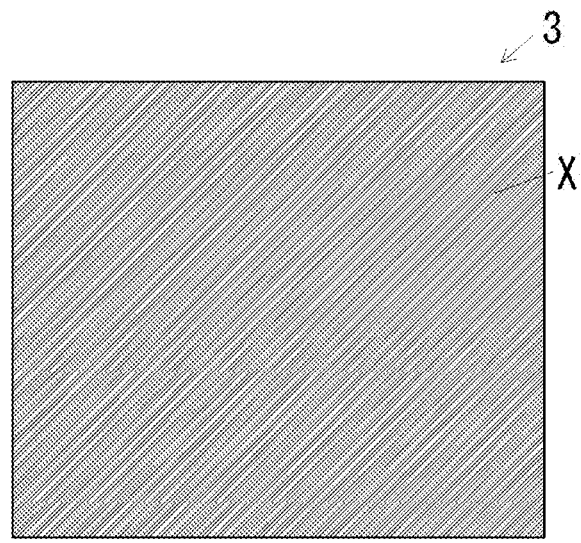
FIG. 4B is a top view of a joining member included in the optical component of the second embodiment.
Figure 5:
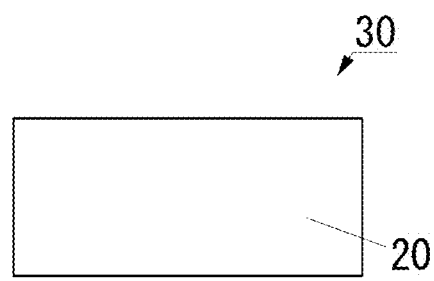
FIG. 5 is a diagram of a light-emitting device that uses the optical component according to the second embodiment in combination with a light-emitting element.
Figure 5:
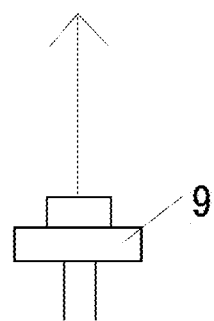

FIG. 3A to 3C illustrate a method of manufacturing an optical component 20 according to a second embodiment. FIG. 4A is a cross-sectional view of the optical component 20 obtained by the present embodiment, and FIG. 4B is a top view of the joining member 3 included in the optical component 20. In FIG. 4B, a hatched region X is a region where its transmittance for light with the predetermined wavelength is high. FIG. 5 is a diagram of a light-emitting device 30 that includes the optical component 20 in combination with a light-emitting element 9 used as the optical semiconductor. The optical component 20 is substantially the same as the optical component 10 in the terms of the features mentioned above, except for what will be described next.

In the present embodiment, in a step of providing the joined body, the joined body is provided to include the second member 2, the joining member 3, the first member 1, a second joining member 8, and a third member 7 arranged in this order from the bottom. Specifically, as shown in FIG. 3A, the first metal film 3a is formed on the lower surface of the first member 1, the third metal film 8a is formed on the upper surface of the first member 1, the second metal film 3b is formed on the upper surface of the second member 2, and a fourth metal film 8b is formed on the lower surface of the third member 7. Then, the lower surface of the first metal film 3a and the upper surface of the second metal film 3b are directly bonded together, and the upper surface of a third metal film 8a and the lower surface of the fourth metal film 8b are directly bonded together, whereby a joined body as shown in FIG. 3B is provided. In the present embodiment, a phosphor-containing plate is used as the first member 1, a sapphire substrate is used as the second member 2, and a sapphire substrate is used as the third member 7. Then, in a step of irradiating the joining member 3 with a laser beam or a microwave, the microwave is irradiated in the present embodiment. At this time, as shown in FIG. 3C, not only the joining member 3 but also the second joining member 8 are irradiated with a microwave. Consequently, as indicated in a region Y of FIG. 4A, the transmittance of the second joining member 8 also becomes high.

Also in this method of manufacturing the optical component 20, the optical component 20, in which the joining member 3 is less likely to absorb light, can be easily manufactured. The light transmittance of the joining member 3 can be enhanced over a wide range in a relatively short time by irradiating the joining member 3 with a microwave. Further, because the third member 7 is joined with the upper surface side of the first member 1, heat generated by phosphors included in the phosphor-containing plate can be easily dissipated.

In the present embodiment, the phosphor-containing plate as the first member 1 includes the phosphor portion 1a and the light reflective portion 1b provided at the lateral surface of the phosphor portion 1a so as to surround the phosphor portion 1a viewed from the upper surface side of the first member 1.

In the present embodiment, the light transmittance of the entire region of the joining member 3 and the second joining member 8 is high. However, as in the first embodiment, in the case where the transmittance of the joining member for the light with the predetermined wavelength is enhanced by irradiation with the laser beam, it is preferable that the light transmittance of region located above and below the light reflective portion 1b in the joining member 3 and the second joining member 8 remain the original transmittance. In other words, only the regions located above and below the phosphor portion 1a are preferably irradiated with the laser beam. In this way, the region of the joining member 3 and the second joining member 8 that does not affect the extraction of light can have metallic properties, so that heat directed from the phosphor toward the light reflective portion 1b can be easily dissipated into the second member 2 and the third member 7.

As shown in FIG. 5, the light-emitting device 30 uses a laser diode (LD) as a light-emitting element 9. This is because, in the case of using the LD as the light-emitting element 9, the phosphor is greatly needed to be improved in heat dissipation, increasing the need to join the second member 2. The light-emitting element 9 is not limited thereto. Alternatively, a LED can also be used as the light-emitting element 9.

<Third Embodiment>

Figure 6A:
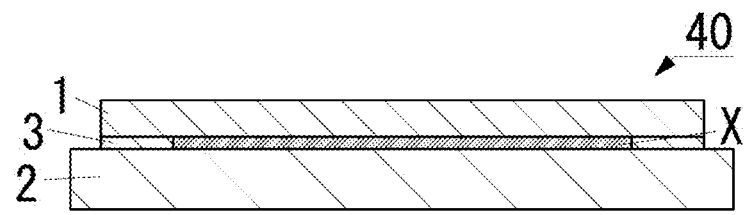
FIG. 6A is a cross-sectional view of an optical component obtained by a method of manufacturing an optical component according to a third embodiment.
Figure 6B:
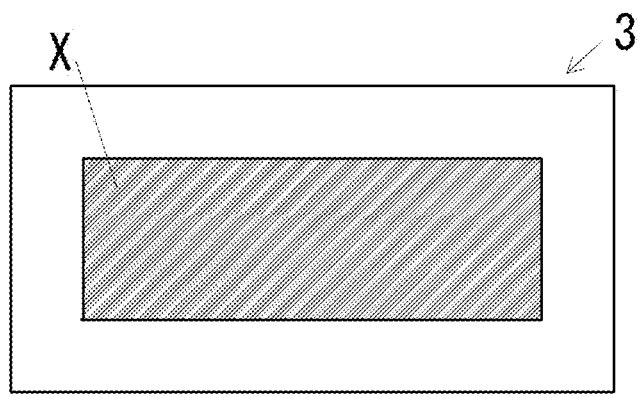
FIG. 6B is a top view of a joining member included in the optical component of the third embodiment.
Figure 7:
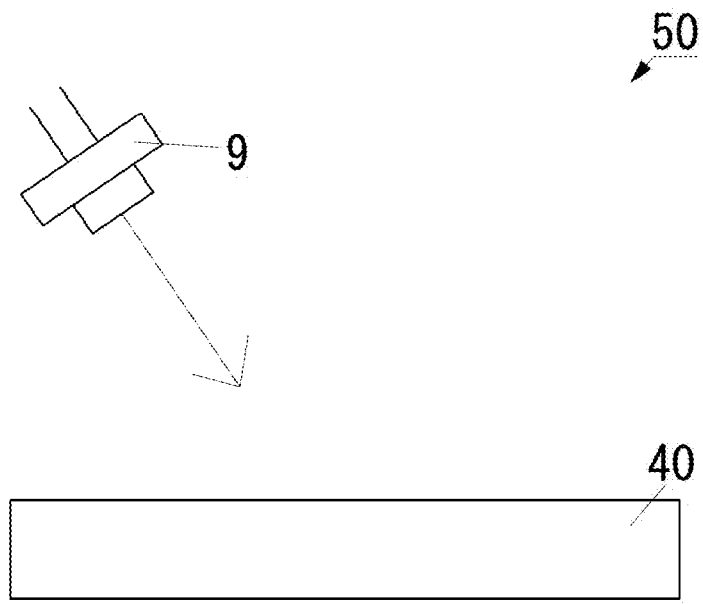
FIG. 7 is a diagram of a light-emitting device that uses the optical component according to the third embodiment in combination with a light-emitting element.

FIG. 6A is a cross-sectional view of an optical component 40 obtained by a method of manufacturing the optical component 40 according to a third embodiment. FIG. 6B is a top view of the joining member 3 included in the optical component 40. In FIG. 6B, a hatched region X is a region with the high transmittance for light with the predetermined wavelength. FIG. 7 is a schematic diagram of a light-emitting device 50 that uses the optical component 40 in combination with a light-emitting element 9 used as the optical semiconductor. The optical component 40 is substantially the same as the optical component 10 in the terms of the features mentioned above, except for what will be described next.

In the present embodiment, a non-light-transmissive member is used as the second member 2. Specifically, a phosphor-containing plate is used as the first member 1, and a metal plate is used as the second member 2. Further, in the step of irradiating the joining member 3 with a laser beam or a microwave, a central region including center of the joining member 3 is irradiated with the laser beam as viewed from above, and a region around the central region (irradiated region) is kept at the original transmittance.

Also in the present embodiment, the optical component 40, in which the joining member 3 is less likely to absorb light from the light-emitting element or the like, can be manufactured easily. When the second member 2 is made of a metal plate, light from the light-emitting element 9 is easily absorbed by the upper surface of the second member 2. However, as in the present embodiment, the light to be absorbed into the second member 2 can be reduced by interposing the joining member 3 with a high light transmittance between the first member 1 and the second member 2. This is because light incident at a small angle among the light entering from the first member 1 side can be totally reflected and extracted by the joining member 3 with the high transmittance.

Referring to FIG. 6A, the phosphor-containing plate in which a phosphor is contained across its entirety, but alternatively may be one that contains a phosphor portion and a light reflective portion.

As shown in FIG. 7, for example, the optical component 40 can be combined with the LD as the light-emitting element 9 to form the light-emitting device 50. Referring to FIG. 7, the upper surface of the first member 1 is irradiated with the light from the light-emitting element 9, and light generated by the phosphor or the like is extracted from the same plane (upper surface) side.

EXAMPLES

Figure 8A:
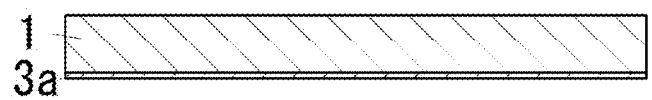
FIG. 8A is a diagram for explaining a method of manufacturing an optical component according to an example.
Figure 8A:
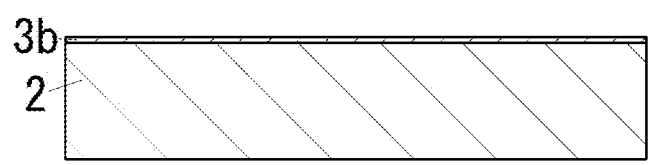
Figure 8B:
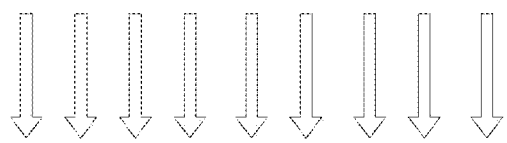
FIG. 8B is a diagram for explaining the method of manufacturing an optical component according to the example.

An optical component 60 was produced by the following manufacturing method. First, both surfaces of two respective sapphire substrates were polished to provide a first member 1 made of a sapphire substrate with a thickness of 100 µm and a second member 2 made of a sapphire substrate with a thickness of 550 µm. Then, a bonded body in which the first member 1 and the second member 2 were bonded together via the joining member 3 was provided by using the atomic diffusion bonding method. Specifically, first, as shown in FIG. 8A, a first metal film 3a made of Al with a thickness of 0.5 nm was formed on the lower surface of the first member 1, and a second metal film 3b made of Al with a thickness of 0.5 nm was formed on the upper surface of the second member 2. As shown in FIG. 8B, the lower surface of the first metal film 3a and the upper surface of the second metal film 3b were directly joined together. At this time, the formation of the first metal film 3a, the formation of the second metal film 3b, and the joining of the first metal film 3a with the second metal film 3b were performed in the ultra high vacuum.

Figure 8C:
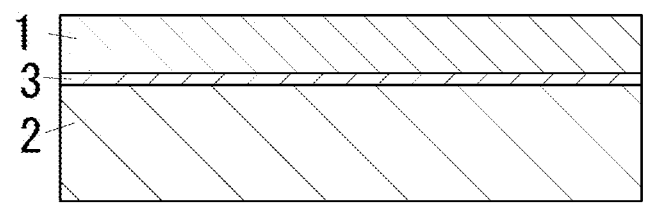
FIG. 8C is a diagram for explaining the method of manufacturing an optical component according to the example.

Then, as shown in FIG. 8C, the joining member 3 was irradiated with the laser beam from the upper surface side of the first member 1 so that the light transmittance of the joining member 3 was higher than the original light transmittance thereof. As the laser beam, a pulsed YAG laser beam having a wavelength of 355 nm was used. At this time, the repetition frequency of the pulsed laser beam was set at 60 kHz, and the pulse width thereof was set at approximately 25 nanoseconds. The output of the laser beam was constant at 400 mW, and the feed rate of the joined body was set at 1 mm/sec. Further, the focal position of the laser beam was set at a position of approximately 100 µm from the upper surface of the joined body. Then, the jointed body was scanned by using a laser beam in the vertical direction as viewed from above. This scanning was performed a plurality of times while being shifted by 20 µm in the direction perpendicular to the scanning direction.

Figure 9A:
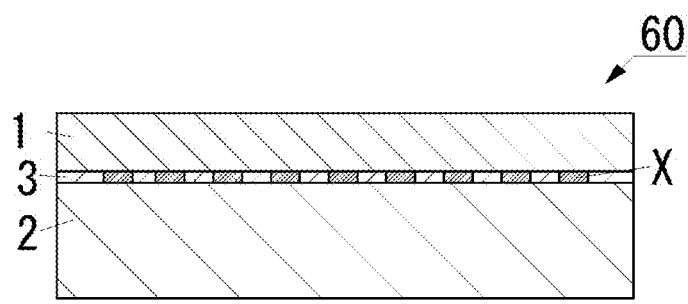
FIG. 9A is a cross-sectional view of an optical component obtained by the method of manufacturing the optical component according to the example.
Figure 9B:
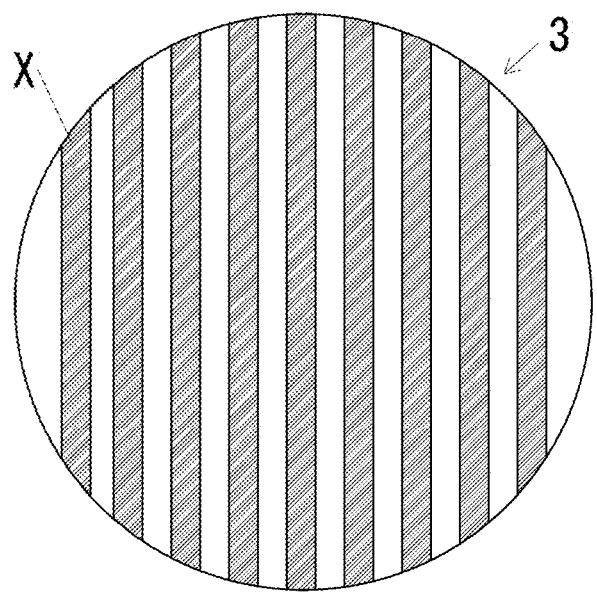
FIG. 9B is a top view of a joining member included in the optical component according to the example.
Figure 10:
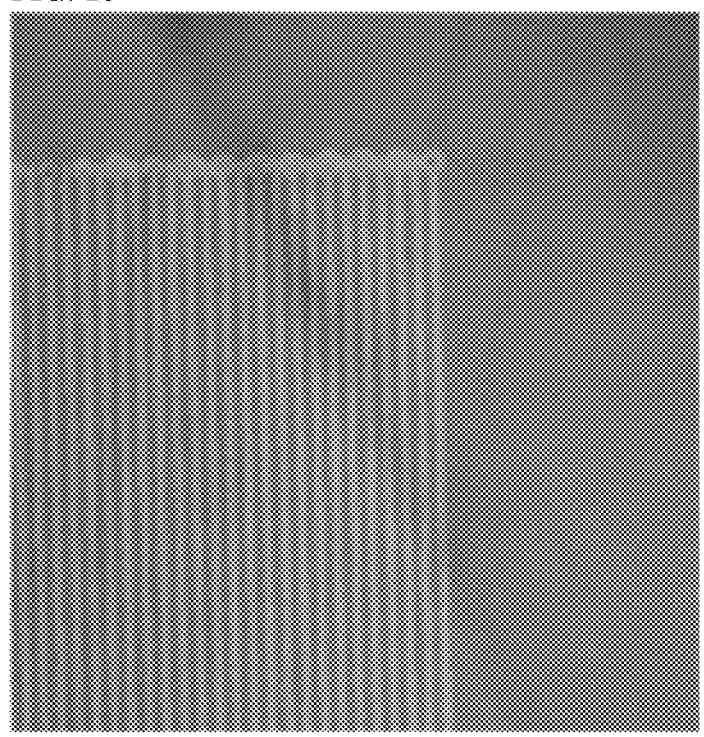
FIG. 10 shows a photograph of an optical component obtained by the method of manufacturing an optical component according to the example, observed from the upper surface side.

FIG. 9A shows a cross-sectional view of the resulting optical component 60, and FIG. 9B shows a top view of the joining member 3 included in the optical component 60. FIG. 10 shows a photograph of the optical component 60 observed from its upper surface side by irradiation with a white light from its lower surface side. In FIG. 10, a region in a bright color is a region irradiated with the laser beam, and a region in a dark color is a region not irradiated with the laser beam (with the original transmittance of the joining member 3). From this result, it is confirmed that the light transmittance of a part of the joining member 3 irradiated with the laser beam was higher than the light transmittance of a part of the joining member 3 not irradiated with the laser beam.

Figure 11:
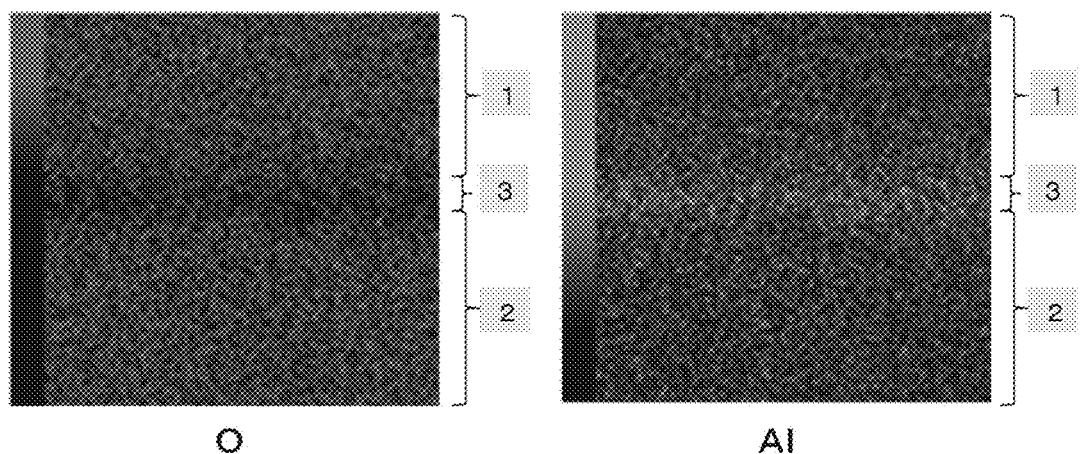
FIG. 11 shows analysis results of a joined body according to the example.
Figure 12:
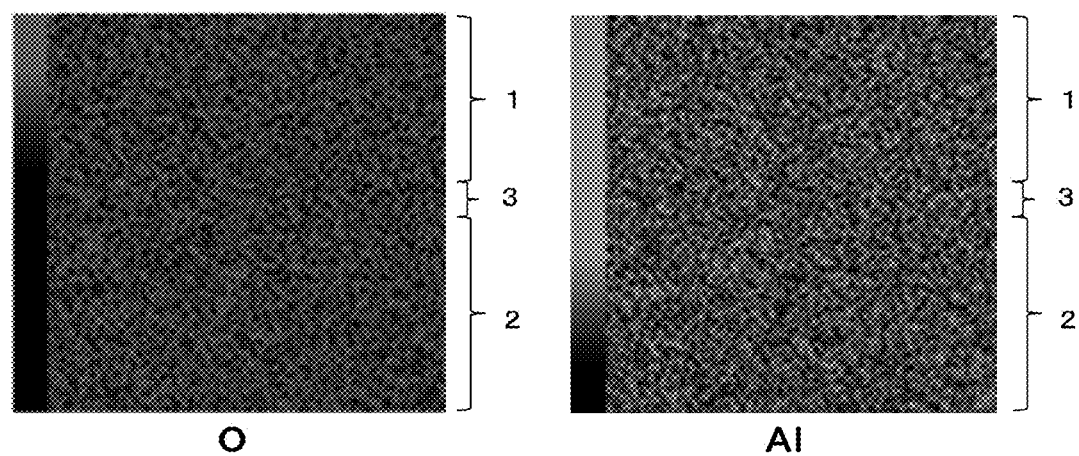
FIG. 12 shows analysis results of the optical component according to the example.

FIGS. 11 and 12 show the results of mapping measurement of oxygen and aluminum in the joining member 3 and its vicinity by energy dispersive X-ray analysis. FIG. 11 shows the pictures taken before irradiation with the laser beam, while FIG. 12 shows the pictures taken after irradiation with the laser beam. In FIGS. 11 and 12, the joining member 3 is positioned in the central area of each figure. As shown in FIG. 11, in the joining member 3, the amount of aluminum is larger, and the amount of oxygen is smaller than those in the first member 1 and the second member 2. This is because the first member 1 and the second member 2 are made of sapphire, respectively, while the joining member 3 is made of aluminum having a property of metal. Meanwhile, from FIG. 12, it can be seen that the distribution of aluminum and oxygen is uniform over the first member 1, the joining member 3, and the second member 2 as a whole. That is, from FIG. 12, it can be reasonably understood that the light-transmissive property is enhanced because the aluminum having property of metal is converted into aluminum oxide by the irradiation with the laser beam.

Figure 13:
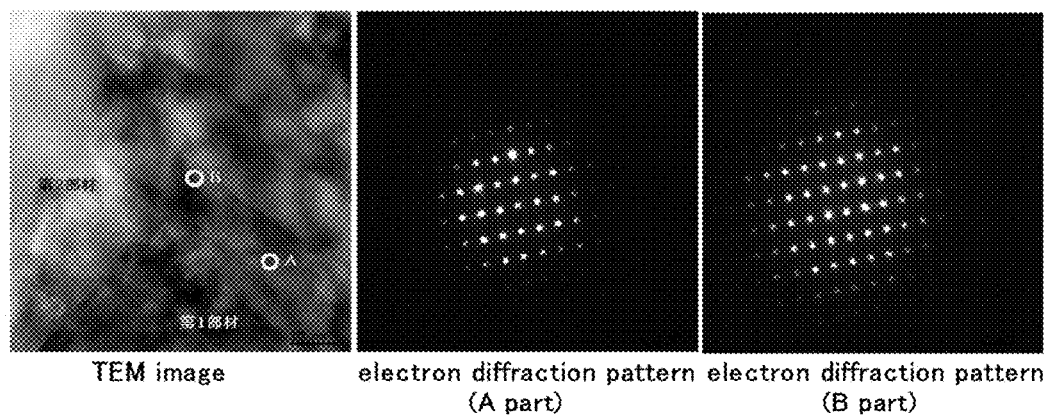
FIG. 13 shows analysis results of the joined body according to the example.
Figure 14:
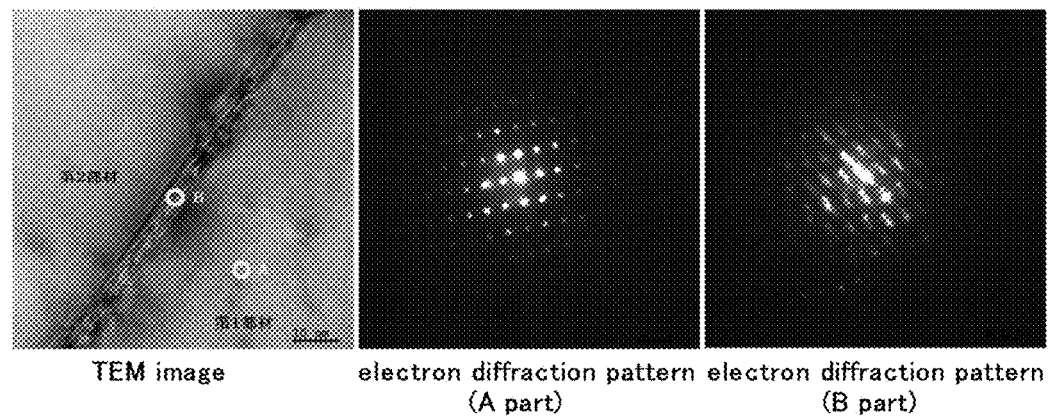
FIG. 14 shows analysis results of the optical component according to the example.

Further, FIG. 13 and FIG. 14 respectively show a TEM image (left diagram) in the joining member 3 and its vicinity, an electron diffraction pattern (center diagram) in an A part of the left diagram, and an electron diffraction pattern (right diagram) in a B part of the left diagram. FIG. 13 shows the pictures taken before irradiation with the laser beam, while FIG. 14 shows the picture taken after irradiation with the laser beam. According to FIGS. 13 and 14, it was confirmed that the joining member 3 and its vicinity were in the single crystal state, regardless of before and after the irradiation with the laser beam. From this result, it was found that the joining member 3 maintains its crystallinity without being converted into an amorphous state, even after the irradiation with the laser beam.

The optical component according to the embodiments herein can be used for lighting devices, vehicle-mounted devices, and the like.

What is claimed is:

1. A method of manufacturing an optical component for an optical semiconductor, the method comprising:
   providing a joined body comprising:
      a first member having light transmissivity and containing at least one element selected from the group consisting of oxygen, fluorine, and nitrogen, and
      a second member,
      wherein the first member and the second member are bonded via a metal joining member made by directly bonding a first metal film formed on the first member and a second metal film formed on the second member; and
   after providing the joined body in which the first member and the second member are bonded via the metal joining member, irradiating the metal joining member with a laser beam or a microwave.

2. The method of manufacturing an optical component according to claim 1, wherein the metal joining member is irradiated with the laser beam.

3. The method of manufacturing an optical component according to claim 2, further comprising;
   prior to the step of providing the joined body:
      providing a light emitting semiconductor element that includes the second member and a light emitting structure, which is the optical semiconductor, on a first main surface of the second member, and
      forming the first metal film on a surface of the first member, and
      forming the second metal film on a second main surface of the second member,
   wherein the second member has light transmissivity.

4. The method of manufacturing an optical component according to claim 3, wherein the laser beam is irradiated to only part of the metal joining member.

5. The method of manufacturing an optical component according to claim 1, wherein the second member has light transmissivity.

6. The method of manufacturing an optical component according to claim 5, wherein the second member contains at least one element selected from the group consisting of oxygen, fluorine, and nitrogen.

7. The method of manufacturing an optical component according to claim 6, wherein the first member contains oxygen.

8. The method of manufacturing an optical component according to claim 7, wherein the first member contains at least one material selected from the group consisting of sapphire, glass and phosphor.

9. The method of manufacturing an optical component according to claim 8, further comprising:

prior to the step of providing the joined body:

providing a light emitting semiconductor element that includes the second member and a light emitting structure, which is the optical semiconductor, on a first main surface of the second member, and forming the first metal film on a surface of the first member, and forming the second metal film on a second main surface of the second member, wherein the second member has light transmissivity.

10. The method of manufacturing an optical component according to claim 9, wherein the first member is made of sapphire or glass.

11. The method of manufacturing an optical component according to claim 10, wherein the first metal film is formed of Al or Ti.

12. The method of manufacturing an optical component according to claim 11, wherein, prior to the step of forming the first metal film, the surface of the first member on which the first metal film is formed is subjected to a hydrophilization treatment.

13. The method of manufacturing an optical component according to claim 12, wherein the first member contains phosphor.

14. The method of manufacturing an optical component according to claim 13, wherein the metal joining member is irradiated with the laser beam.

15. The method of manufacturing an optical component according to claim 14, wherein the laser beam is irradiated to only part of the metal joining member.

16. The method of manufacturing an optical component according to claim 1, wherein the first metal film and the second metal film are bonded by an atomic diffusion bonding method.

17. The method of manufacturing an optical component according to claim 16, wherein the metal joining member has a thickness in a range of 0.2 nm to 5 nm.

18. The method of manufacturing an optical component according to claim 1, wherein the step of irradiating the metal joining member with a laser beam or a microwave is performed so as to improve a transmittance of the metal joining member for light with a predetermined wavelength.

19. The method of manufacturing an optical component according to claim 18, wherein the first metal film and the second metal film are bonded by an atomic diffusion bonding method.

20. The method of manufacturing an optical component according to claim 19, wherein the metal joining member has a thickness in a range of 0.2 nm to 5 nm.

* * * * *